(12) United States Patent
Luo et al.

(10) Patent No.: US 11,469,716 B2
(45) Date of Patent: Oct. 11, 2022

(54) LIMITING CIRCUIT AND ELECTRONIC DEVICE

(71) Applicant: Sony Semiconductor Solutions Corporation, Kanagawa (JP)

(72) Inventors: Dan Luo, Kanagawa (JP); Koichi Misui, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 89 days.

(21) Appl. No.: 17/048,445

(22) PCT Filed: Feb. 21, 2019

(86) PCT No.: PCT/JP2019/006449
§ 371 (c)(1),
(2) Date: Oct. 16, 2020

(87) PCT Pub. No.: WO2019/207928
PCT Pub. Date: Oct. 31, 2019

(65) Prior Publication Data
US 2021/0091725 A1    Mar. 25, 2021

(30) Foreign Application Priority Data

Apr. 26, 2018    (JP) .............................. JP2018-085140

(51) Int. Cl.
*H03F 1/34*    (2006.01)
*H03F 1/52*    (2006.01)
*H03F 3/45*    (2006.01)

(52) U.S. Cl.
CPC ........... *H03F 1/52* (2013.01); *H03F 3/45475* (2013.01); *H03F 2200/03* (2013.01); *H03F 2200/426* (2013.01)

(58) Field of Classification Search
CPC .................................... H03F 1/34; H03F 3/45
USPC .......................................... 330/293, 85, 252
See application file for complete search history.

(56) References Cited

U.S. PATENT DOCUMENTS

| 6,011,435 | A | * | 1/2000 | Takeyabu | ............ | H03F 3/45475 330/252 |
| 8,970,300 | B2 | * | 3/2015 | Piepenstock | ........ | H03F 3/45497 330/307 |
| 9,748,908 | B1 | * | 8/2017 | Tan | ........................... | H03F 3/04 |
| 9,787,291 | B1 | * | 10/2017 | Reindl | ................. | H03H 19/004 |
| 10,133,287 | B2 | * | 11/2018 | Yang | ....................... | G05F 1/575 |

FOREIGN PATENT DOCUMENTS

JP    2003-318684 A    11/2003

* cited by examiner

*Primary Examiner* — Henry Choe
(74) *Attorney, Agent, or Firm* — Michael Best & Friedrich LLP

(57) ABSTRACT

In a limiting circuit that limits an output voltage of an operational amplifier, the signal quality of the output voltage is improved.
The limiting circuit includes a short-circuit transistor and a gate voltage supply unit. In the limiting circuit, the short-circuit transistor short-circuits a path between an input terminal and an output terminal of the operational amplifier in a case where a voltage between the input terminal of the operational amplifier and the gate is higher than a predetermined threshold voltage. Furthermore, in the limiting circuit, the gate voltage supply unit supplies a voltage to the gate, the voltage depending on the threshold voltage and the output voltage of the output terminal.

14 Claims, 9 Drawing Sheets

LIMITING CIRCUIT AND ELECTRONIC DEVICE

TECHNICAL FIELD

The present technology relates to a limiting circuit and an electronic device. More specifically, the present invention relates to a limiting circuit and an electronic device that limit the level of an analog signal.

BACKGROUND ART

In an electronic device such as an audio device or a sensor, for the purpose of protecting a circuit at a subsequent stage of an amplifier circuit that amplifies an analog signal, or the like, a limiting circuit has conventionally been used that limits an output voltage of the amplifier circuit within a predetermined limit range. For example, a limiting circuit has been devised that is provided with a transistor that short-circuits the input and output terminals of an operational amplifier when being in the ON state, and a resistor and a current source that supply a constant voltage to the gate of the transistor (for example, see Patent Document 1). In this limiting circuit, the current source supplies a current to the resistor to generate the constant voltage.

CITATION LIST

Patent Document

Patent Document 1: Japanese Patent Application Laid-Open No. 2003-318684

SUMMARY OF THE INVENTION

Problems to be Solved by the Invention

In the conventional technology described above, a difference between a constant voltage and a threshold voltage of the transistor is set as a limit voltage, and in a case where the output voltage exceeds the limit voltage or is less than the limit voltage, the transistor shifts to the ON state and the input and output terminals of the operational amplifier are short-circuited. Due to this short circuit of the input and output terminals, the gain of the amplifier circuit is zero, so that the output voltage can be limited within the limit range. However, in a case where there is variation in the threshold voltage of the transistor, the variation may cause the limit voltage to deviate from a design value. As a result, the signal quality of the output voltage may degrade. For example, balance between an upper limit and a lower limit of the limit range is lost, a ratio of the maximum sound to the minimum sound (decibel or the like) has a value different from that before the limitation, and sound quality of an audio signal or the like degrades. Furthermore, due to the degradation of the sound quality, recognition accuracy degrades when voice recognition is performed on a signal of a voice or the like limited.

The present technology is created in view of such a situation, and aims to improve the signal quality of the output voltage in the limiting circuit that limits the output voltage of the operational amplifier.

Solutions to Problems

The present technology has been made to solve the problems described above, and a first aspect thereof is a limiting circuit including: a short-circuit transistor that short-circuits a path between an input terminal and an output terminal of an operational amplifier in a case where a voltage between the input terminal of the operational amplifier and the gate is higher than a predetermined threshold voltage; and a gate voltage supply unit that supplies a voltage to the gate, the voltage depending on the threshold voltage and an output voltage of the output terminal. As a result, there is an effect that the output voltage is limited by a voltage not depending on the threshold voltage.

Furthermore, in the first aspect, the gate voltage supply unit may supply, to the gate, a voltage obtained by adding the output voltage of the output terminal to a difference between a voltage substantially matching the threshold voltage and a predetermined bias voltage. As a result, there is an effect that the short-circuit transistor is in the ON state when the output voltage reaches a limit voltage.

Furthermore, in the first aspect, the gate voltage supply unit may include: a current source that supplies a constant current; a series resistor connected in series between the current source and the gate of the short-circuit transistor; and an adjustment transistor in the ON state, the adjustment transistor including the gate connected to the connection point between the current source and the series resistor, the source connected to the output terminal, and the drain connected to the gate of the short-circuit transistor. As a result, there is an effect that a voltage obtained by adding the limit voltage to a difference between a threshold voltage of the adjustment transistor and the output voltage is supplied to the gate.

Furthermore, in the first aspect, the short-circuit transistor may include: a first short-circuit transistor of the N-type; and a second short-circuit transistor of the P-type, and the gate voltage supply unit may supply a voltage to the gate of the first short-circuit transistor, the voltage depending on a threshold voltage of the first short-circuit transistor and the output voltage, and may supply a voltage to the gate of the second short circuit transistor, the voltage depending on a threshold voltage of the second short-circuit transistor and the output voltage. As a result, there is an effect that the output voltage is limited by upper and lower limit voltages.

Furthermore, in the first aspect, the operational amplifier may amplify a differential signal, the short-circuit transistor may include: a positive side short-circuit transistor that short-circuits a path between the inverting input terminal and the non-inverting output terminal of the operational amplifier in a case where a voltage between the inverting input terminal of the operational amplifier and the gate is higher than a threshold voltage; and a negative side short-circuit transistor that short-circuits a path between the non-inverting input terminal and the inverting output terminal of the operational amplifier in a case where a voltage between the non-inverting input terminal of the operational amplifier and the gate is higher than a threshold voltage, and the gate voltage supply unit may include: a positive side gate voltage supply unit that supplies a voltage to the gate of the positive side short-circuit transistor, the voltage depending on the threshold voltage of the positive side short-circuit transistor and a positive side output voltage of the non-inverting output terminal; and a negative side gate voltage supply unit that supplies a voltage to the gate of the negative side short-circuit transistor, the voltage depending on the threshold voltage of the negative side short-circuit transistor and a negative side output voltage of the inverting output terminal. As a result, there is an effect that the differential signal is limited.

Furthermore, in the first aspect, the operational amplifier may amplify a single-ended signal. As a result, there is an effect that the single-ended signal is limited.

Furthermore, in the first aspect, an insertion resistor inserted between the short-circuit transistor and the output terminal may be further included. As a result, there is an effect that soft clipping is implemented.

Furthermore, a second aspect of the present technology is an electronic device including: an operational amplifier; a short-circuit transistor that short-circuits a path between an input terminal and an output terminal of the operational amplifier in a case where a voltage between the input terminal of the operational amplifier and the gate is higher than a predetermined threshold voltage; and a gate voltage supply unit that supplies a voltage to the gate, the voltage depending on the threshold voltage and an output voltage of the output terminal. As a result, there is an effect that the output voltage of the operational amplifier is limited by a voltage not depending on the threshold voltage.

Effects of the Invention

According to the present technology, in the limiting circuit that limits the output voltage of the operational amplifier, an excellent effect can be obtained that the signal quality of the output voltage can be improved. Note that, the effect described here is not necessarily limited, and can be any effect described in the present disclosure.

MODE FOR CARRYING OUT THE INVENTION

The following is a description of a mode for carrying out the present technology (the mode will be hereinafter referred to as the embodiment). The description will be made in the following order.

1. First embodiment (example in which voltage depending on threshold voltage and output voltage is supplied to gate)

2. First modification (example in which resistor is inserted and voltage depending on threshold voltage and output voltage is supplied to gate)

3. Second modification (example in which single-ended signal is amplified and voltage depending on threshold voltage and output voltage is supplied to gate)

1. First Embodiment

[Configuration Example of Electronic Device]

Figure 1:
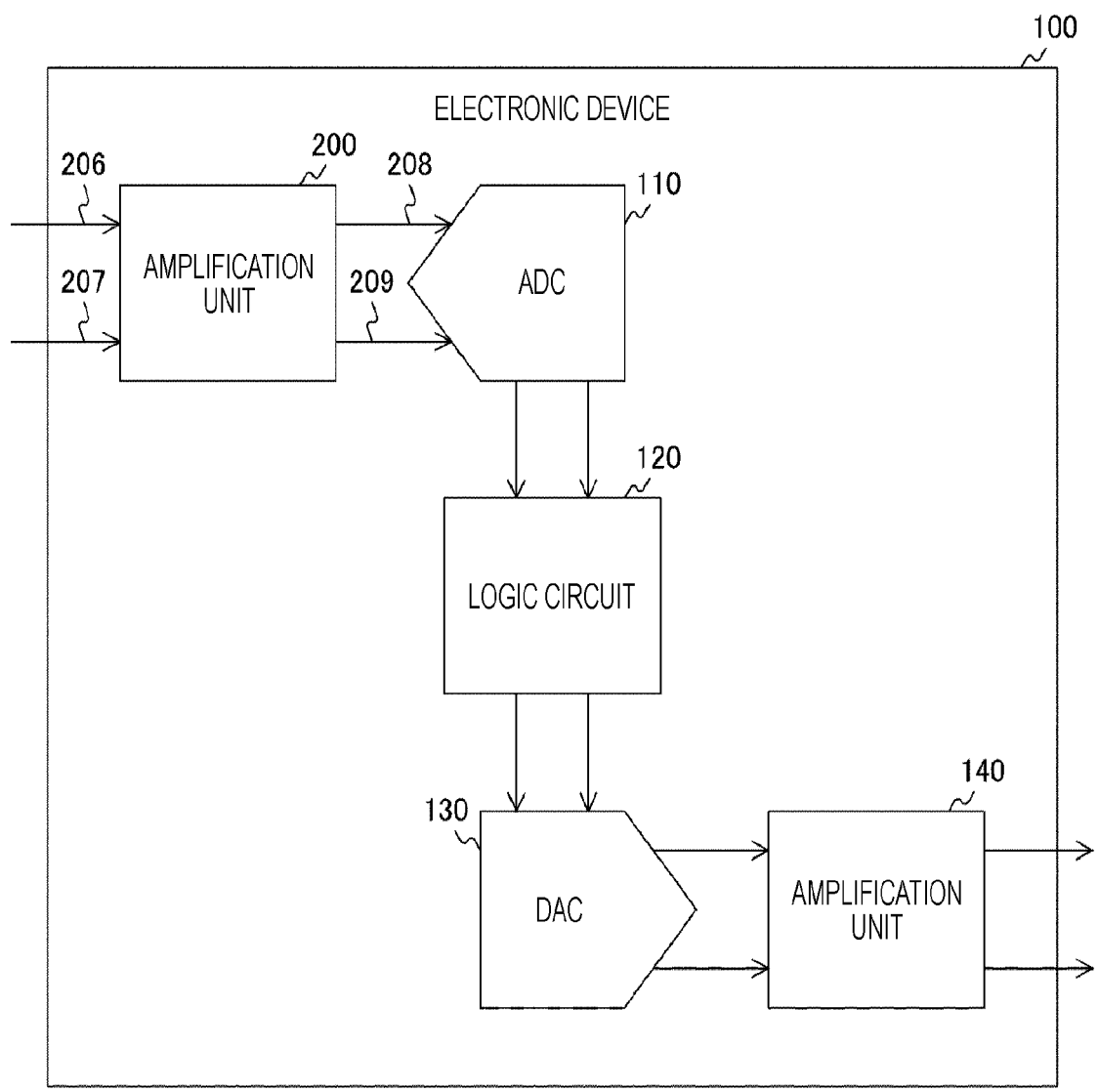
FIG. 1 is a block diagram illustrating a configuration example of an electronic device in a first embodiment of the present technology.

FIG. 1 is a block diagram illustrating a configuration example of an electronic device 100 in a first embodiment of the present technology. The electronic device 100 includes an amplification unit 200, an analog to digital converter (ADC) 110, a logic circuit 120, a digital to analog converter (DAC) 130, and an amplification unit 140. As the electronic device 100, an audio device, a smartphone, or the like is assumed.

The amplification unit 200 amplifies an analog input signal (audio signal or the like). A differential signal is input as an input signal to the amplification unit 200 via signal lines 206 and 207, for example. The amplification unit 200 amplifies the differential signal and outputs the amplified differential signal to the ADC 110 via signal lines 208 and 209.

The ADC 110 converts the analog differential signal from the amplification unit 200 into a digital signal. The ADC 110 supplies the digital signal to the logic circuit 120.

The logic circuit 120 executes various types of processing such as noise canceling processing and voice recognition on the digital signal. The logic circuit 120 supplies a digital signal (audio signal or the like) indicating the processing result to the DAC 130.

The DAC 130 converts the digital signal from the logic circuit 120 into an analog differential signal. The DAC 130 supplies the differential signal to the amplification unit 140.

The amplification unit 140 amplifies the differential signal and outputs the amplified differential signal to a speaker or the like.

[Configuration Example of Amplification Unit]

Figure 2:
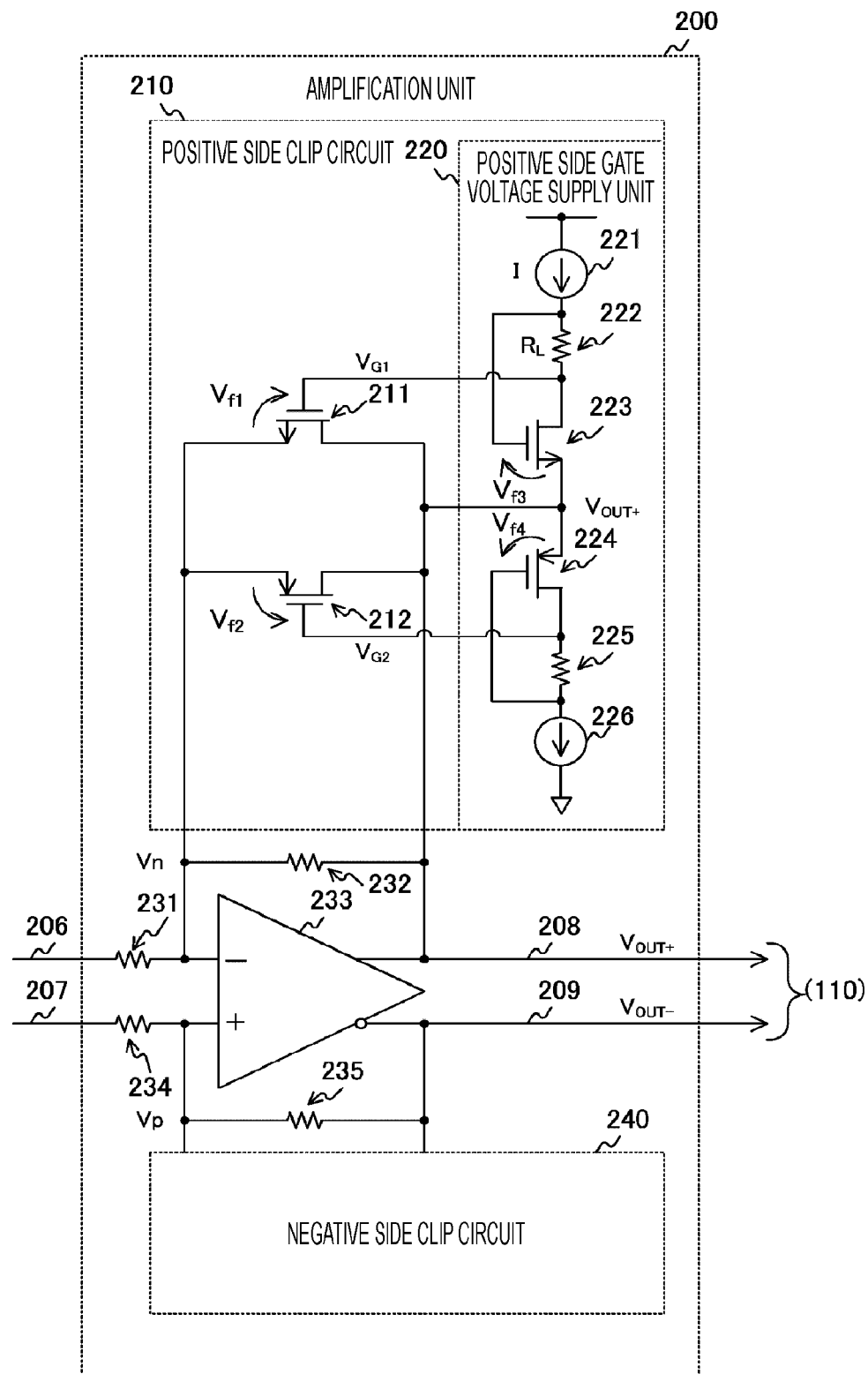
FIG. 2 is a block diagram illustrating a configuration example of an amplification unit in the first embodiment of the present technology.

FIG. 2 is a block diagram illustrating a configuration example of the amplification unit 200 in the first embodiment of the present technology. The amplification unit 200 includes a positive side clip circuit 210, resistors 231, 232, 234, and 235, an operational amplifier 233, and a negative side clip circuit 240.

When a positive side output voltage $V_{OUT+}$ has a value outside a certain limit range, the positive side clip circuit 210 fixes (in other words, clips) its level to limit the voltage within the limit range. The positive side clip circuit 210 includes an N-type transistor 211, a P-type transistor 212, and a positive side gate voltage supply unit 220. As the N-type transistor 211 and the P-type transistor 212, for example, metal-oxide-semiconductor (MOS) transistors are used.

Furthermore, one end of the resistor 231 is connected to the inverting input terminal (−) of the operational amplifier 233. The resistor 232 is inserted between the inverting input terminal (−) and the non-inverting output terminal (+) of the operational amplifier 233.

Furthermore, one end of the resistor 234 is connected to the non-inverting input terminal (+) of the operational amplifier 233. The resistor 235 is inserted between the non-inverting input terminal (+) and the inverting output terminal (−) of the operational amplifier 233.

Furthermore, the non-inverting output terminal (+) and the inverting output terminal (−) of the operational amplifier 233 are connected to the ADC 110, and the positive side output voltage $V_{OUT+}$ and a negative side output voltage $V_{OUT-}$ are output from these terminals.

With the connection configuration described above, a circuit including the resistors 231, 232, 234, and 235, and the operational amplifier 233 functions as an inverting amplifier circuit. In the case of not being clipped by the positive side clip circuit 210, a gain G of the inverting amplifier circuit is expressed by the following expression.

$$G = -R_2/R_1$$

In the above expression, $R_1$ is the resistance value of each of the resistors 231 and 234, and $R_2$ is a resistance value of each of the resistors 232 and 235. The unit of these resistance values is, for example, ohm (Ω).

Furthermore, the N-type transistor 211 shifts to the ON state in a case where a voltage between the inverting input terminal (−) of the operational amplifier and the gate is higher than a threshold voltage $V_{f1}$, and short-circuits a path between the inverting input terminal (−) and the non-inverting output terminal (+). The P-type transistor 212 has a configuration similar to the N-type transistor 211 except that the threshold voltage is $V_{f2}$. The sources of these transistors are all connected to the inverting input terminal (−).

Due to short circuit of either the N-type transistor 211 or the P-type transistor 212, the gain of the inverting amplifier circuit is zero, and the positive side output voltage $V_{OUT+}$ is clipped.

Note that, the N-type transistor 211 and the P-type transistor 212 are examples of the positive side short-circuit transistor described in the claims. Furthermore, the N-type transistor 211 is an example of the first short-circuit transistor described in the claims, and the P-type transistor 212 is an example of the second short-circuit transistor described in the claims.

The positive side gate voltage supply unit 220 supplies voltages to the respective gates of the N-type transistor 211 and the P-type transistor 212, the voltages each depending on the threshold voltage ($V_{f1}$ or $V_{f2}$) and the positive side output voltage $V_{OUT+}$. The positive side gate voltage supply unit 220 includes current sources 221 and 226, resistors 222 and 225, an N-type transistor 223, and a P-type transistor 224. As the N-type transistor 223 and the P-type transistor 224, for example, MOS transistors are used.

The current sources 221 and 226 each supply a constant current. The current source 221 and the resistor 222 are connected in series between a power supply and the gate of the N-type transistor 211. Furthermore, the resistor 225 and the current source 226 are connected in series between the gate of the P-type transistor 212 and a terminal (ground terminal or the like) having a predetermined reference potential.

The gate of the N-type transistor 223 is connected to the connection point between the current source 221 and the resistor 222, the source is connected to the non-inverting output terminal (+) of the operational amplifier 233, and the drain is connected to the gate of the N-type transistor 211.

Furthermore, the gate of the P-type transistor 224 is connected to the connection point between the resistor 225 and the current source 226, the source is connected to the non-inverting output terminal (+) of the operational amplifier 233, and the drain is connected to the gate of the P-type transistor 212.

Note that, the N-type transistor 223 and the P-type transistor 224 are examples of the adjustment transistor described in the claims.

Since a sufficiently high level depending on a power supply voltage is applied to the gate of the N-type transistor 223, this transistor is always in the ON state. Furthermore, the gate of the N-type transistor 223 is connected to the connection point between the current source 221 and the resistor 222. For this reason, a potential of the connection point is a sum of the positive side output voltage $V_{OUT+}$ and a threshold voltage $V_{f3}$ of the N-type transistor 223. Then, the potential of the connection point drops by an amount of a bias generated by a current flowing through the resistor 222, so that a gate potential $V_{G1}$ of the N-type transistor 211 is expressed by the following expression.

$$V_{G1} = (V_{OUT+}) + V_{f3} - IR_L \qquad \text{Expression 1}$$

In the above expression, I is a current supplied by the current source 221, and $R_L$ is a resistance value of the resistor 222.

Furthermore, the N-type transistor 211 shifts to the ON state in a case where the following expression is satisfied.

$$V_{G1} - Vn > V_{f1} \qquad \text{Expression 2}$$

In the above expression, Vn is a negative side input voltage of the inverting input terminal (−) of the operational amplifier 233.

By substituting Expression 1 into Expression 2 and performing transformation, the following expression is obtained.

$$V_{OUT+} > V_{f1} - V_{f3} + IR_L + Vn \qquad \text{Expression 3}$$

In Expression 3, the threshold voltage $V_{f3}$ of the N-type transistor 223 is set to a voltage substantially matching the threshold voltage $V_{f1}$ of the N-type transistor 211. Here, "substantially match" means being completely the same, or that the difference is within an allowable value. For example, by making the sizes of these transistors the same as each other, and arranging the transistors adjacently in the layout, the threshold voltage $V_{f3}$ and the threshold voltage $V_{f1}$ can be substantially matched.

Since the threshold voltage $V_{f3}$ and the threshold voltage $V_{f1}$ substantially match, the expression 3 can be replaced by the following expression.

$$V_{OUT+} > IR_L + Vn \qquad \text{Expression 4}$$

From Expression 4, when the positive side output voltage $V_{OUT+}$ is higher than the negative side input voltage Vn by $IR_L$, the N-type transistor 211 shifts to the ON state and the positive side output voltage $V_{OUT+}$ is clipped. Thus, the $IR_L$ corresponds to an upper limit voltage in the limit range.

On the other hand, when the threshold voltage of the P-type transistor 224 is $V_{f4}$, a gate potential $V_{G2}$ of the P-type transistor 212 is expressed by the following expression. Here, it is assumed that a value of a current supplied by the current source 226 is the same as a current supplied by the current source 221, and a resistance value of the resistor 225 is the same as that of the resistor 222.

$$V_{G2} = (V_{OUT+}) - V_{f4} + IR_L \qquad \text{Expression 5}$$

Furthermore, the P-type transistor 212 shifts to the ON state in a case where the following expression is satisfied.

$$Vn - V_{G2} > V_{f2} \qquad \text{Expression 6}$$

By substituting Expression 5 into Expression 6 and performing transformation, the following expression is obtained.

$$V_{OUT+} < V_{f4} - V_{f2} - IR_L + Vn \qquad \text{Expression 7}$$

In Expression 7, the threshold voltage $V_{f4}$ of the P-type transistor 224 is set to a voltage substantially matching the threshold voltage $V_{f2}$ of the P-type transistor 212. Thus, Expression 7 can be replaced by the following expression.

$$V_{OUT+} < -IR_L + Vn \quad \text{Expression 8}$$

From Expression 8, when the positive side output voltage $V_{OUT+}$ is lower than the negative side input voltage Vn by $IR_L$, the P-type transistor 212 shifts to the ON state and the positive side output voltage $V_{OUT+}$ is clipped. Thus, $-IR_L$ corresponds to a lower limit voltage in the limit range.

Here, a comparative example is assumed in which the N-type transistor 223 and the P-type transistor 224 are not arranged, the resistor 222 is inserted between the non-inverting output terminal (+) and the N-type transistor 211, and the resistor 225 is inserted between the non-inverting output terminal (+) and the P-type transistor 212. Furthermore, similarly, it is assumed that the current sources 221 and 226 supply a current I to those resistors. In this comparative example, the positive side output voltage $V_{OUT+}$ is clipped in a case where any one of the following expressions is satisfied.

$$V_{OUT+} > V_{f1} - IR_L + Vn \quad \text{Expression 9}$$

$$V_{OUT+} > V_{f2} + IR_L + Vn \quad \text{Expression 10}$$

From Expressions 9 and 10, if the threshold voltages $V_{f1}$ and $V_{f2}$ of the respective N-type transistor 211 and the P-type transistor 212 vary, the upper and lower limit voltages may fluctuate, and their absolute values may be different values. As a result, balance between the upper limit and the lower limit is lost, the positive side output voltage $V_{OUT+}$ after amplification does not have an ideal waveform obtained by amplifying the input voltage Vn before amplification, and the signal quality degrades. Furthermore, functions (noise canceling function, and the like) due to the subsequent processing may degrade.

On the other hand, in the amplification unit 200, as exemplified in Expression 1 and Expression 5, the positive side gate voltage supply unit 220 supplies the voltages $V_{G1}$ and $V_{G2}$, the voltages respectively depending on $V_{f3}$ and $V_{f4}$ substantially matching the threshold voltages $V_{f1}$ and $V_{f2}$ and depending on the positive side output voltage $V_{OUT+}$. As a result, influence of the threshold voltage is canceled, and the limit voltage has a value not depending on the threshold voltage, as exemplified in Expression 4 and Expression 8. Thus, it is possible to prevent degradation of signal quality due to variations in threshold voltage.

Note that, when one of the current sources 221 and 226 increases the current in proportion to the temperature, it is desirable that the other decreases the current (that is, the temperature characteristics are opposite from each other). As a result, the positive side clip circuit 210 can generate a limit voltage that does not depend on temperature.

Furthermore, the positive side gate voltage supply unit 220 is not limited to the one having the circuit configuration exemplified in the figure as long as it can supply the voltage exemplified in Expression 1 and Expression 5 to the gate.

Furthermore, the positive side clip circuit 210 performs clipping at both the upper limit and the lower limit, but may perform clipping at only one of the upper limit or the lower limit. In a case where the positive side clip circuit 210 performs clipping only at the upper limit, the P-type transistor 212, the P-type transistor 224, the resistor 225, and the current source 226 corresponding to the lower limit are unnecessary. Furthermore, in a case where the positive side clip circuit 210 performs clipping only at the lower limit, the N-type transistor 211, the N-type transistor 223, the resistor 222, and the current source 221 corresponding to the upper limit are unnecessary. The same applies to the negative side clip circuit 240 described later.

[Negative Side Clip Circuit Configuration Example]

Figure 3:
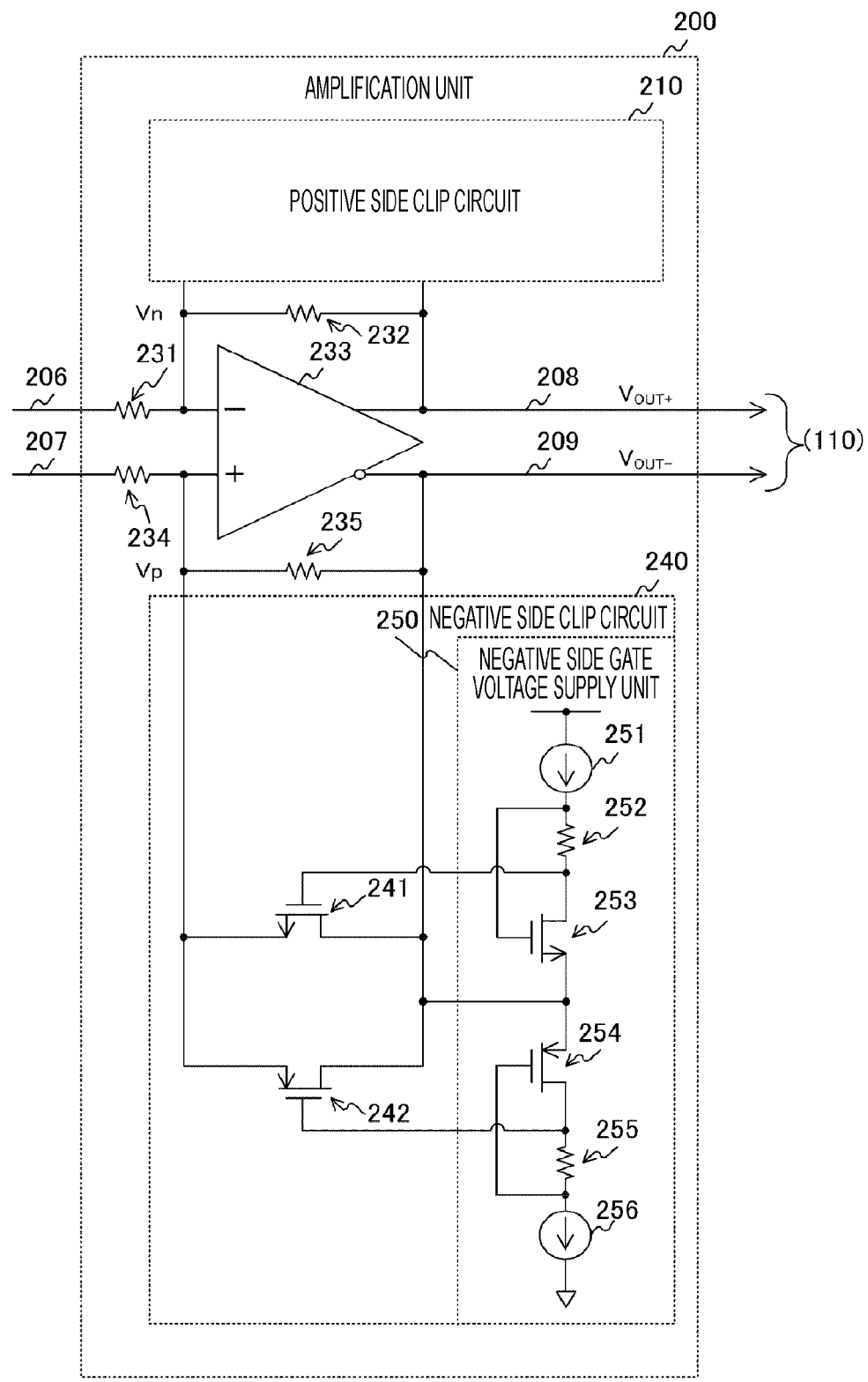
FIG. 3 is a block diagram illustrating a configuration example of a negative side clip circuit in the first embodiment of the present technology.

FIG. 3 is a block diagram illustrating a configuration example of the negative side clip circuit 240 in the first embodiment of the present technology. The negative side clip circuit 240 includes an N-type transistor 241, a P-type transistor 242, and a negative side gate voltage supply unit 250. Furthermore, the negative side gate voltage supply unit 250 includes current sources 251 and 256, resistors 252 and 255, an N-type transistor 253, and a P-type transistor 254. As the N-type transistor 241, the P-type transistor 242, the N-type transistor 253, and the P-type transistor 254, for example, MOS transistors are used. A circuit configuration of the negative side clip circuit 240 is similar to that of the positive side clip circuit 210, except that the negative side clip circuit 240 is connected to the non-inverting input terminal (+) and the inverting output terminal (−).

Note that, a clip circuit including the positive side clip circuit 210 and the negative side clip circuit 240 is an example of the limiting circuit described in the claims. Furthermore, the N-type transistor 241 and the P-type transistor 242 are examples of the negative side short-circuit transistor described in the claims. Furthermore, the N-type transistor 241 is an example of the first short-circuit transistor described in the claims, and the P-type transistor 242 is an example of the second short-circuit transistor described in the claims.

Figure 4:
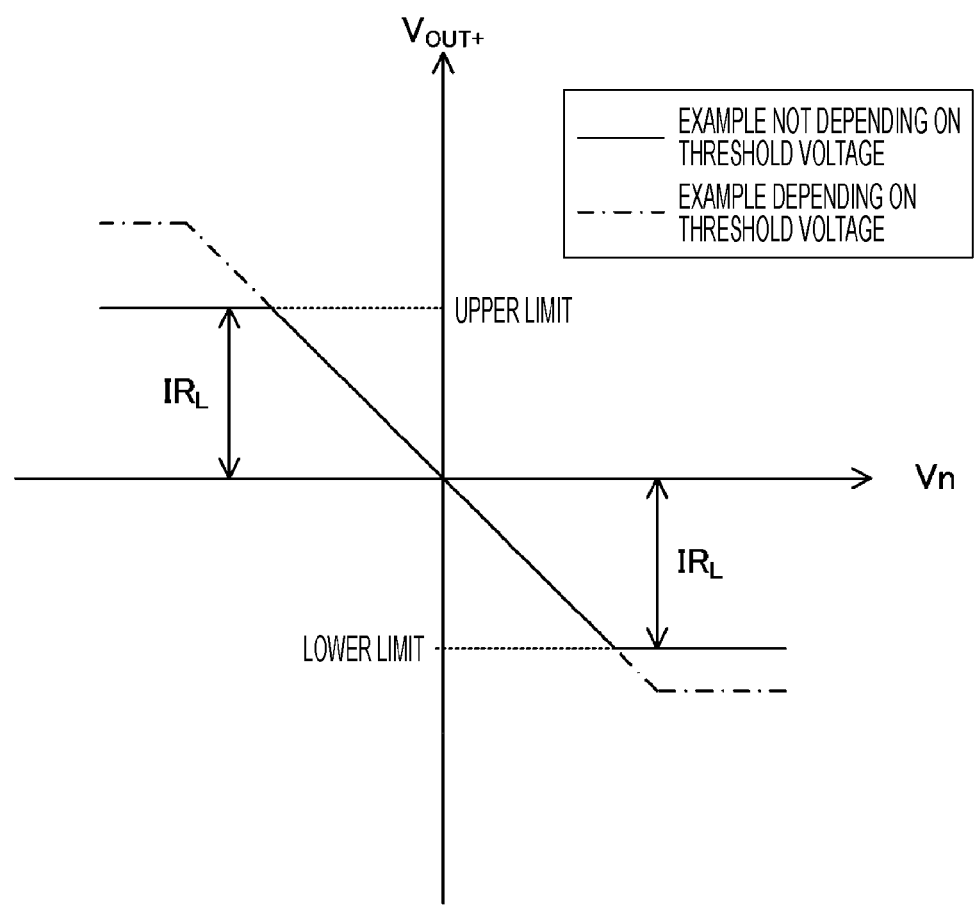
FIG. 4 is a graph illustrating an example of the input-output characteristic of the amplification unit in the first embodiment of the present technology.

FIG. 4 is a graph illustrating an example of the input-output characteristic of the amplification unit 200 in the first embodiment of the present technology. In the figure, the horizontal axis represents the negative side input voltage Vn, and the vertical axis represents the positive side output voltage $V_{OUT+}$. Furthermore, the solid line in the figure indicates the input-output characteristic of the amplification unit 200 that uses the limit voltage not depending on the threshold voltage of the transistor, and the one dot chain line indicates the input-output characteristic of the comparative example that uses the limit voltage depending on the threshold voltage of the transistor.

The inverting amplifier circuit including the operational amplifier 233 inverts and amplifies the negative side input voltage Vn and outputs the inverted and amplified voltage as the positive side output voltage $V_{OUT+}$.

On the other hand, the positive side clip circuit 210 clips the positive side output voltage $V_{OUT+}$ in a case where a relative voltage of the positive side output voltage $V_{OUT+}$ with respect to the negative side input voltage Vn (in other words, a difference between the negative side input voltage Vn and the positive side output voltage $V_{OUT+}$) exceeds the upper limit voltage $+IR_L$. Furthermore, the positive side clip circuit 210 clips the positive side output voltage $V_{OUT+}$ in a case where the relative voltage (difference) of the positive side output voltage $V_{OUT+}$ is less than the lower limit voltage $-IR_L$. As a result, the positive side output voltage $V_{OUT+}$ with respect to the negative side input voltage Vn is limited within the limit range from the limit voltages $-IR_L$ to $+IR_L$.

Since the limit voltages $-IR_L$ and $+IR_L$ used by the amplification unit 200 are determined only by the current I and the resistance value $R_L$, it is easy to adjust the upper limit and the lower limit to be the same. On the other hand, in the comparative example, the upper limit voltage depends on the threshold voltage $V_{f1}$ of the N-type transistor from the expression 9, and the lower limit voltage depends on the threshold voltage $V_{f2}$ of the P-type transistor from the expression 10. It is difficult to adjust the threshold voltages of the P-type transistor and the N-type transistor to be the same, and they often have different values due to manufacturing variations and the like. For this reason, in the comparative example, the upper limit and the lower limit have different values, as exemplified by the one dot chain line. As a result, there is a possibility that the waveform when the swinging positive side output voltage $V_{OUT+}$ is clipped deviates from the ideal waveform obtained by amplifying the negative side input voltage Vn and is distorted.

As described above, according to the first embodiment of the present technology, the voltage depending on the threshold voltage and the output voltage is supplied to the N-type transistor 221, and the like, so that the output voltage can be limited by a certain limit voltage not depending on the threshold value. As a result, it is possible to prevent the upper and lower limit voltages from being inconsistent due to the variation in the threshold voltage, so that the signal quality of the differential signal after amplification can be improved.

<2. First Modification>

In the first embodiment described above, the peak of the signal waveform is linearly cut and clipped at the level of the limit voltage. Such a clip method is called a hard clipping. Due to this hard clipping, when an audio signal having a gentle locus is amplified, a signal waveform before amplification is lost. Then, a high frequency component appears that is a cause of generation of "clicking" or "popping" sounds (so-called pop noise) generated from the speaker when the power supply is turned on and off. On the other hand, a method of performing clipping so that a peak portion of the signal waveform is gently saturated not to damage the signal waveform is called soft clipping. This first modification of the first embodiment differs from the first embodiment in that soft clipping is performed.

Figure 5:
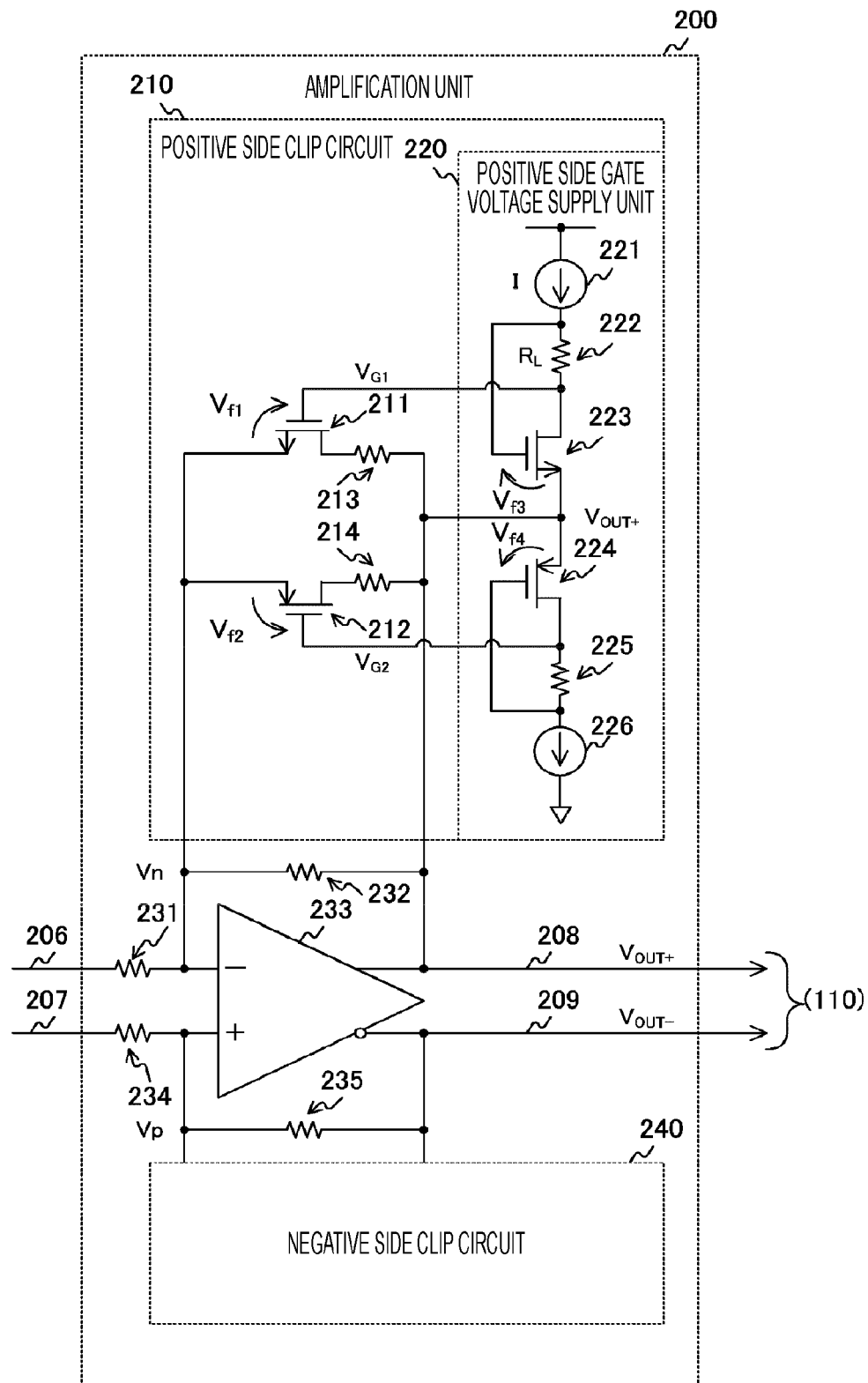
FIG. 5 is a block diagram illustrating a configuration example of a positive side clip circuit in a first modification of the first embodiment of the present technology.

FIG. 5 is a block diagram illustrating a configuration example of the positive side clip circuit 210 in the first modification of the first embodiment of the present technology. The positive side clip circuit 210 of the first modification of the first embodiment differs from the first embodiment in that resistors 213 and 214 are further included.

As the resistor 213 and the like, for example, an on-resistance of a transistor or a polysilicon resistor is used. In a case where the on-resistance of the transistor is used, the resistance value can be changed by changing a ratio between the gate width and the gate length of the transistor. However, it is necessary to pay attention to manufacturing variation of the resistance value. Furthermore, attention is to be paid to the variations in the resistance values of the N-type and P-type.

The resistor 213 is inserted between the non-inverting output terminal (+) of the operational amplifier 233 and the N-type transistor 211. The resistor 214 is inserted between the non-inverting output terminal (+) of the operational amplifier 233 and the P-type transistor 212. When these resistance values are $R_{ON}$, the gain of the amplifier circuit at the time of an excessive input outside the limit range is "$-R_{ON}/R1$", so that the output waveform is not sharply clipped, and is gradually saturated and clipped.

Figure 6:
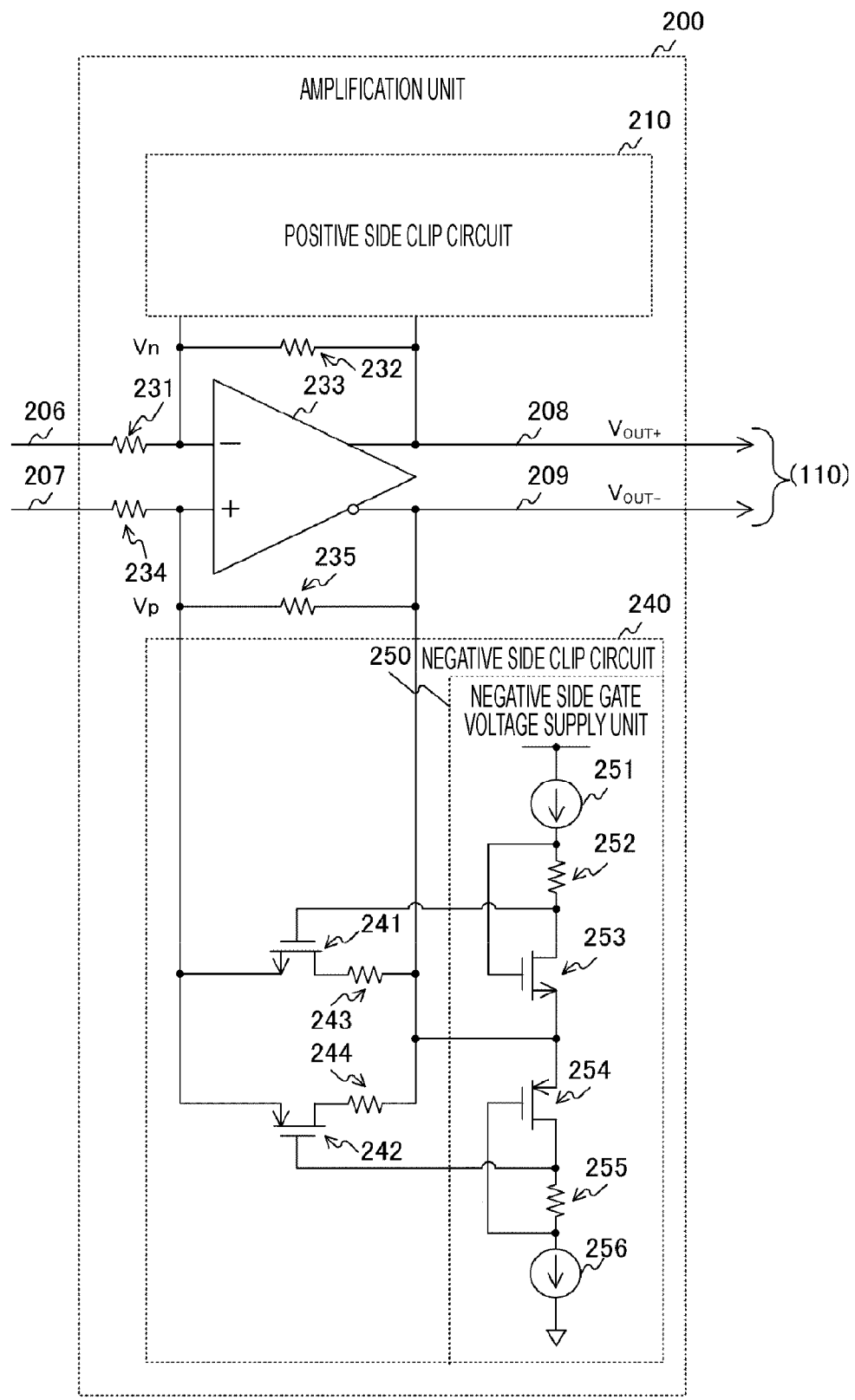
FIG. 6 is a block diagram illustrating a configuration example of the negative side clip circuit in the first modification of the first embodiment of the present technology.

FIG. 6 is a block diagram illustrating a configuration example of the negative side clip circuit 240 in the first modification of the first embodiment of the present technology. The negative side clip circuit 240 of the first modification of the first embodiment is different from the first embodiment in that resistors 243 and 244 are further included. The insertion positions of these resistors are similar to those of the positive side clip circuit 210.

Note that, the resistors 213, 214, 243, and 244 are examples of the insertion resistors described in the claims.

Figure 7:
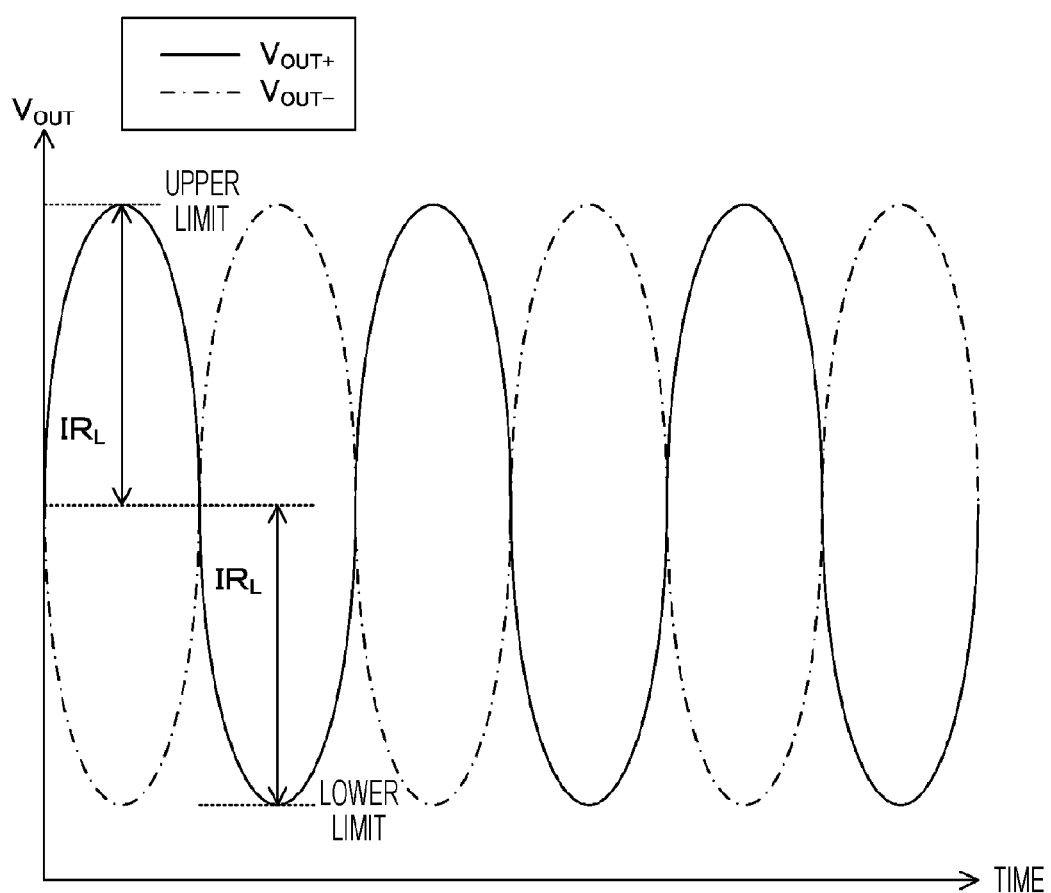
FIG. 7 is a graph illustrating an example of a waveform of an output voltage in the first modification of the first embodiment of the present technology.

FIG. 7 is a graph illustrating an example of the waveform of the output voltage in the first modification of the first embodiment of the present technology. In the figure, the vertical axis represents the positive side output voltage $V_{OUT+}$ and the negative side output voltage $V_{OUT-}$, and the horizontal axis represents time. Furthermore, the solid line indicates the locus of the positive side output voltage $V_{OUT+}$, and the one dot chain line indicates the locus of the negative side output voltage $V_{OUT-}$.

Since the upper and lower limit voltages of the amplification unit 200 do not depend on the threshold voltage of the transistor, it is easy to adjust them to be the same. The signal quality can be improved by adjusting the upper limit and the lower limit to be the same. Furthermore, the peak portion of the signal waveform is gently clipped due to addition of the resistor 213 and the like.

Figure 8:
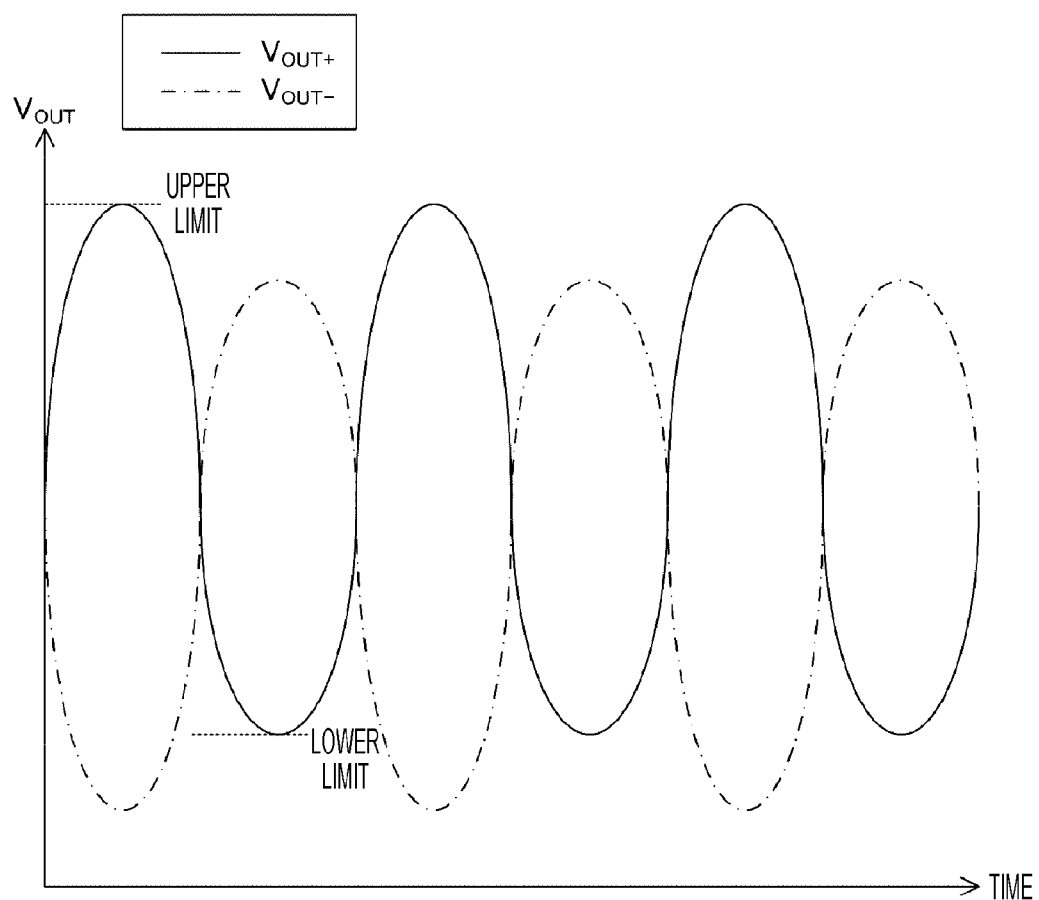
FIG. 8 is a graph illustrating an example of the waveform of the output voltage in a comparative example.

FIG. 8 is a graph illustrating an example of the waveform of the output voltage in the comparative example. In the figure, the vertical axis represents the positive side output voltage $V_{OUT+}$ and the negative side output voltage $V_{OUT-}$, and the horizontal axis represents time. Furthermore, the solid line indicates the locus of the positive side output voltage $V_{OUT+}$, and the one dot chain line indicates the locus of the negative side output voltage $V_{OUT-}$.

In the comparative example, since the upper limit and the lower limit depend on the threshold voltage of the transistor, the upper limit and the lower limit are different voltages. As a result, the waveform of the output voltage is distorted and the signal quality degrades.

As described above, according to the first modification of the first embodiment of the present technology, the resistor 213 and the like are inserted between the output terminal and the N-type transistor 211 and the like, so that soft clipping can be implemented. As a result, the signal can be amplified without losing the original signal waveform before amplification. Furthermore, it is possible to prevent pop noise due to generation of high frequency components.

<3. Second Modification>

In the first embodiment described above, the amplification unit 200 amplifies the differential signal; however, when the differential signal is amplified, clip circuits are required on both the positive side and the negative side, the circuit scale and cost increase as compared with a case where the clip circuit is arranged only for one of them. The amplification unit 200 in a second modification of the first embodiment differs from the first embodiment in that a single-ended signal is amplified.

Figure 9:
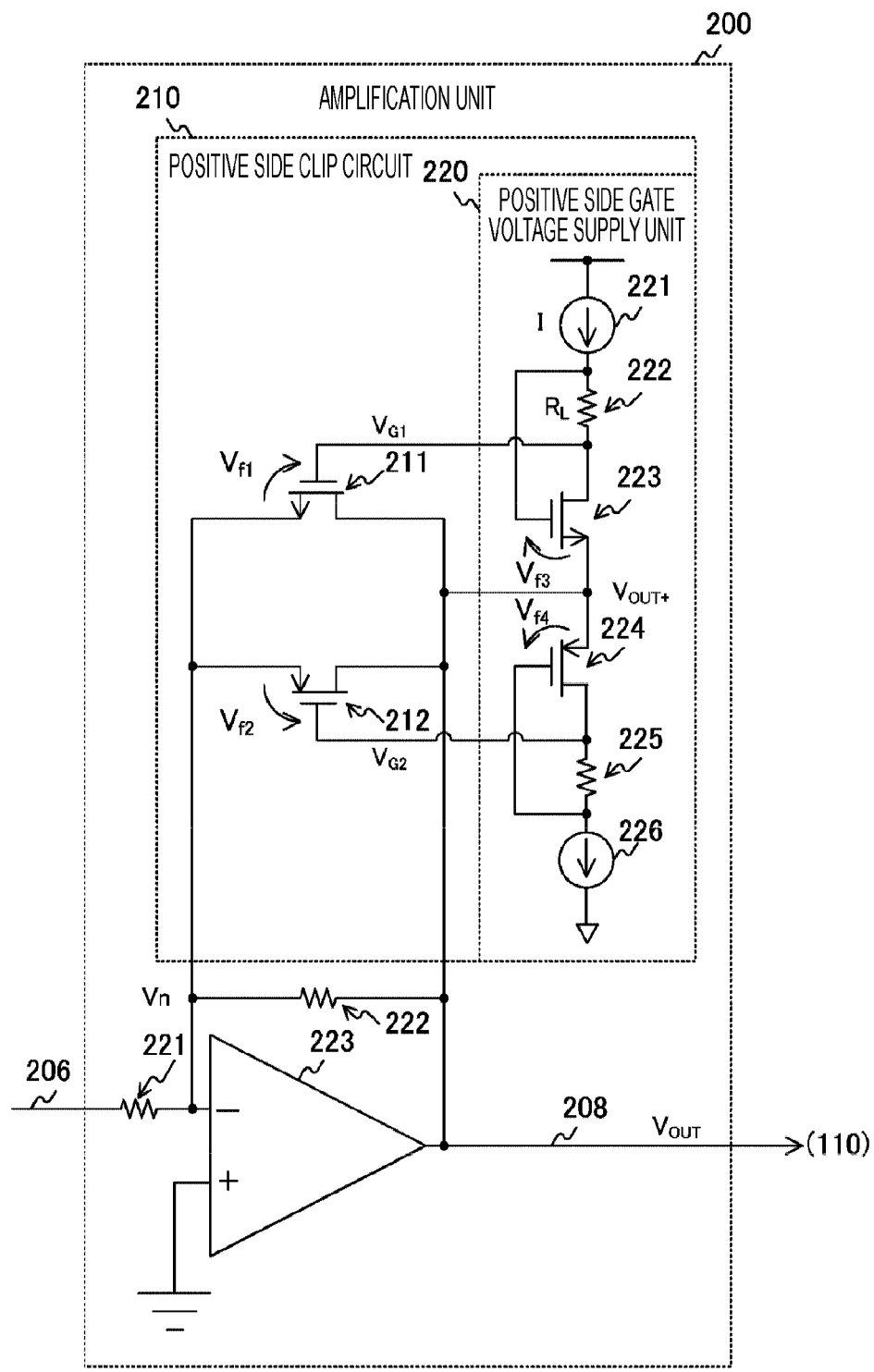
FIG. 9 is a block diagram illustrating a configuration example of the amplification unit in a second modification of the first embodiment of the present technology.

FIG. 9 is a block diagram illustrating a configuration example of the amplification unit 200 in the second modification of the first embodiment of the present technology. The amplification unit 200 of the second modification of the first embodiment is different from the first embodiment in that the negative side clip circuit 240 and the resistors 234 and 235 are not arranged. Furthermore, the non-inverting input terminal (+) of the operational amplifier 233 is connected to the ground terminal, and the single-ended signal is input to the inverting input terminal (−).

Note that, in the second modification of the first embodiment, the soft clipping can also be implemented by inserting the resistor 213 and the like as in the first modification.

As described above, in the first modification of the first embodiment of the present technology, only the positive side clip circuit 210 is arranged, and the circuit limits the single-ended signal, so that the circuit scale and cost can be reduced as compared with a case where the differential signal is amplified.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that, the present technology can also be configured as described below.

(1) A limiting circuit including:
a short-circuit transistor that short-circuits a path between an input terminal and an output terminal of an operational amplifier in a case where a voltage between the input terminal of the operational amplifier and the gate is higher than a predetermined threshold voltage; and
a gate voltage supply unit that supplies a voltage to the gate, the voltage depending on the threshold voltage and an output voltage of the output terminal.

(2) The limiting circuit according to (1), in which the gate voltage supply unit supplies, to the gate, a voltage obtained by adding the output voltage of the output terminal to a difference between a voltage substantially matching the threshold voltage and a predetermined bias voltage.

(3) The limiting circuit according to (2), in which the gate voltage supply unit includes:
a current source that supplies a constant current;
a series resistor connected in series between the current source and the gate of the short-circuit transistor; and
an adjustment transistor in the ON state, the adjustment transistor including the gate connected to the connection point between the current source and the series resistor, the source connected to the output terminal, and the drain connected to the gate of the short-circuit transistor.

(4) The limiting circuit according to claim 1, in which the short-circuit transistor includes:
a first short-circuit transistor of the N-type; and
a second short-circuit transistor of the P-type,
and
the gate voltage supply unit supplies a voltage to the gate of the first short-circuit transistor, the voltage depending on a threshold voltage of the first short-circuit transistor and the output voltage, and supplies a voltage to the gate of the second short circuit transistor, the voltage depending on a threshold voltage of the second short-circuit transistor and the output voltage.

(5) The limiting circuit according to any of (1) to (4), in which
the operational amplifier amplifies a differential signal,
the short-circuit transistor includes:
a positive side short-circuit transistor that short-circuits a path between the inverting input terminal and the non-inverting output terminal of the operational amplifier in a case where a voltage between the inverting input terminal of the operational amplifier and the gate is higher than a threshold voltage; and a negative side short-circuit transistor that short-circuits a path between the non-inverting input terminal and the inverting output terminal of the operational amplifier in a case where a voltage between the non-inverting input terminal of the operational amplifier and the gate is higher than a threshold voltage, and
the gate voltage supply unit includes:
a positive side gate voltage supply unit that supplies a voltage to the gate of the positive side short-circuit transistor, the voltage depending on the threshold voltage of the positive side short-circuit transistor and a positive side output voltage of the non-inverting output terminal; and
a negative side gate voltage supply unit that supplies a voltage to the gate of the negative side short-circuit transistor, the voltage depending on the threshold voltage of the negative side short-circuit transistor and a negative side output voltage of the inverting output terminal.

(6) The limiting circuit according to any of (1) to (4), in which
the operational amplifier amplifies a single-ended signal.

(7) The limiting circuit according to any of (1) to (6), further including
an insertion resistor inserted between the short-circuit transistor and the output terminal.

(8) An electronic device including:
an operational amplifier;
a short-circuit transistor that short-circuits a path between an input terminal and an output terminal of the operational amplifier in a case where a voltage between the input terminal of the operational amplifier and the gate is higher than a predetermined threshold voltage; and
a gate voltage supply unit that supplies a voltage to the gate, the voltage depending on the threshold voltage and an output voltage of the output terminal.

REFERENCE SIGNS LIST

100 Electronic device
110 ADC
120 Logic circuit
130 DAC
140, 200 Amplification unit
210 Positive side clip circuit
211, 223, 241, 253 N-type transistor
212, 224, 242, 254 P-type transistor
213, 214, 222, 225, 231, 232, 234, 235, 243, 244, 252, 255 Resistor
220 Positive side gate voltage supply unit
221, 226, 251, 256 Current source
233 Operational amplifier
240 Negative side clip circuit
250 Negative side gate voltage supply unit

The invention claimed is:
1. A limiting circuit comprising:
a short-circuit transistor including a first terminal connected to an input terminal of an operational amplifier and a second terminal connected to an output terminal of the operational amplifier so as to selectively short-circuit a path between the input terminal and the output terminal of the operational amplifier in a case where a voltage between the input terminal of the operational amplifier and a gate of the short-circuit transistor is higher than a predetermined threshold voltage; and
a gate voltage supply circuit that supplies a voltage to the gate, the voltage depending on the threshold voltage and an output voltage of the output terminal.

2. A limiting circuit comprising:
a short-circuit transistor that short-circuits a path between an input terminal and an output terminal of an operational amplifier in a case where a voltage between the input terminal of the operational amplifier and a gate of the short-circuit transistor is higher than a predetermined threshold voltage; and
a gate voltage supply circuit that supplies a voltage to the gate, the voltage depending on the threshold voltage and an output voltage of the output terminal, wherein
the gate voltage supply circuit supplies, to the gate, a voltage obtained by adding the output voltage of the output terminal to a difference between a voltage substantially matching the threshold voltage and a predetermined bias voltage.

3. The limiting circuit according to claim 2, wherein
the gate voltage supply circuit includes:
a current source that supplies a constant current;
a series resistor connected in series between the current source and the gate of the short-circuit transistor; and
an adjustment transistor in an ON state, the adjustment transistor including a gate connected to a connection point between the current source and the series resistor, a source connected to the output terminal, and a drain connected to the gate of the short-circuit transistor.

4. A limiting circuit comprising:
a short-circuit transistor that short-circuits a path between an input terminal and an output terminal of an operational amplifier in a case where a voltage between the input terminal of the operational amplifier and a gate of the short-circuit transistor is higher than a predetermined threshold voltage, and
a gate voltage supply circuit that supplies a voltage to the gate, the voltage depending on the threshold voltage and an output voltage of the output terminal, wherein
the short-circuit transistor includes:
a first short-circuit transistor of an N-type; and
a second short-circuit transistor of a P-type, and
the gate voltage supply circuit supplies a voltage to a gate of the first short-circuit transistor, the voltage depending on a threshold voltage of the first short-circuit transistor and the output voltage, and supplies a voltage to a gate of the second short circuit transistor, the voltage depending on a threshold voltage of the second short-circuit transistor and the output voltage.

5. A limiting circuit comprising:
a short-circuit transistor that short-circuits a path between an input terminal and an output terminal of an operational amplifier in a case where a voltage between the input terminal of the operational amplifier and a gate of the short-circuit transistor is higher than a predetermined threshold voltage, and
a gate voltage supply circuit that supplies a voltage to the gate, the voltage depending on the threshold voltage and an output voltage of the output terminal, wherein
the operational amplifier amplifies a differential signal,
the short-circuit transistor includes:
a positive side short-circuit transistor that short-circuits a path between an inverting input terminal and a non-inverting output terminal of the operational amplifier in a case where a voltage between the inverting input terminal of the operational amplifier and a gate is higher than a threshold voltage; and
a negative side short-circuit transistor that short-circuits a path between a non-inverting input terminal and an inverting output terminal of the operational amplifier in a case where a voltage between the non-inverting input terminal of the operational amplifier and a gate is higher than a threshold voltage, and
the gate voltage supply circuit includes:
a positive side gate voltage supply circuit that supplies a voltage to the gate of the positive side short-circuit transistor, the voltage depending on the threshold voltage of the positive side short-circuit transistor and a positive side output voltage of the non-inverting output terminal; and
a negative side gate voltage supply circuit that supplies a voltage to the gate of the negative side short-circuit transistor, the voltage depending on the threshold voltage of the negative side short-circuit transistor and a negative side output voltage of the inverting output terminal.

6. The limiting circuit according to claim 1, wherein the operational amplifier amplifies a single-ended signal.

7. The limiting circuit according to claim 1, further comprising an insertion resistor inserted between the short-circuit transistor and the output terminal.

8. An electronic device comprising the limiting circuit according to claim 1.

9. The electronic device according to claim 8, wherein the operational amplifier amplifies a single-ended signal.

10. The electronic device according to claim 8, further comprising:
an insertion resistor inserted between the short-circuit transistor and the output terminal.

11. An electronic device comprising the limiting circuit according to claim 2.

12. The electronic device according to claim 11, wherein the gate voltage supply circuit includes:
a current source that supplies a constant current;
a series resistor connected in series between the current source and the gate of the short-circuit transistor; and
an adjustment transistor in an ON state, the adjustment transistor including a gate connected to a connection point between the current source and the series resistor, a source connected to the output terminal, and a drain connected to the gate of the short-circuit transistor.

13. An electronic device comprising the limiting circuit according to claim 4.

14. An electronic device comprising the limiting circuit according to claim 5.

* * * * *